US012588217B2

(12) United States Patent
Ok et al.

(10) Patent No.: US 12,588,217 B2
(45) Date of Patent: Mar. 24, 2026

(54) PROGRAMMING CURRENT CONTROL FOR ARTIFICIAL INTELLIGENCE (AI) DEVICES

(71) Applicant: International Business Machines Corporation, Armonk, NY (US)

(72) Inventors: Injo Ok, Loudonville, NY (US); Soon-Cheon Seo, Glenmont, NY (US); Youngseok Kim, Upper Saddle River, NJ (US); Timothy Mathew Philip, Albany, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 950 days.

(21) Appl. No.: 17/551,439

(22) Filed: Dec. 15, 2021

(65) Prior Publication Data

US 2023/0189536 A1 Jun. 15, 2023

(51) Int. Cl.
| | |
|---|---|
| *H10B 63/00* | (2023.01) |
| *H10N 70/00* | (2023.01) |
| *H10N 70/20* | (2023.01) |

(52) U.S. Cl.
CPC .......... *H10B 63/20* (2023.02); *H10N 70/063* (2023.02); *H10N 70/231* (2023.02); *H10N 70/826* (2023.02); *H10N 70/8413* (2023.02); *H10N 70/8828* (2023.02)

(58) Field of Classification Search
CPC ............. H10N 70/8828; H10N 70/063; H10N 70/231; H10N 70/826; H10B 63/20
See application file for complete search history.

(56) References Cited

U.S. PATENT DOCUMENTS

| | | | |
|---|---|---|---|
| 8,105,859 | B2 | 1/2012 | Breitwisch et al. |
| 8,611,134 | B2 | 12/2013 | Carter |
| 8,686,391 | B2 | 4/2014 | Schrott et al. |
| 8,728,859 | B2 | 5/2014 | Breitwisch et al. |
| 10,741,756 | B1 | 8/2020 | Ok et al. |
| 12,329,045 | B2 * | 6/2025 | Ok ........................ H10N 70/063 |
| 2007/0096071 | A1 * | 5/2007 | Kordus ............. G11C 13/0004 257/E45.002 |
| 2020/0058848 | A1 * | 2/2020 | El-Hinnawy ...... H10N 70/8613 |
| 2020/0058860 | A1 * | 2/2020 | Howard .............. H10N 70/841 |
| 2020/0287134 | A1 | 9/2020 | Ok et al. |

(Continued)

FOREIGN PATENT DOCUMENTS

| | | |
|---|---|---|
| WO | WO2011119158 A1 | 9/2011 |

OTHER PUBLICATIONS

Koelmans et al., "Projected phase-change memory devices," nature communications (Sep. 2015) (7 pages).

*Primary Examiner* — Mounir S Amer
(74) *Attorney, Agent, or Firm* — Samuel A. Waldbaum

(57) ABSTRACT

Techniques for controlling the programming current of a PCM-based AI device using an external resistor are provided. In one aspect, a PCM cell includes: a PCM stack, that has a bottom electrode; a heater disposed directly on the bottom electrode; a PCM unit including a first material disposed on the heater; a top electrode including a second material disposed on the PCM unit; and a resistor adjacent to the PCM stack, wherein the resistor includes a combination of the first material and the second material. A PCM device that includes at least one of the PCM cells, and a method of forming the PCM cell are also provided.

19 Claims, 8 Drawing Sheets

(56) References Cited

U.S. PATENT DOCUMENTS

| | | |
|---|---|---|
| 2020/0395537 A1 | 12/2020 | Ok et al. |
| 2021/0135104 A1 | 5/2021 | Ok et al. |
| 2021/0305503 A1 | 9/2021 | Philip et al. |

* cited by examiner

PROGRAMMING CURRENT CONTROL FOR ARTIFICIAL INTELLIGENCE (AI) DEVICES

FIELD OF THE INVENTION

The present invention relates to phase change memory (PCM)-based artificial intelligence (AI) devices, and more particularly, to techniques for controlling the programming current of a PCM-based AI device using an external resistor.

BACKGROUND OF THE INVENTION

With their switching, memory, logic, and processing functionality, chalcogenides are ideal materials for use in artificial intelligence (AI) devices such as phase change memory (PCM)-based AI devices. For instance, chalcogenides can provide a wide range of resistance values as the basis of memory operations, where each resistance value corresponds to a distinct structural state of the chalcogenide material. One or more of the structural states can be selected and used to define operational memory states.

Specifically, chalcogenide materials exhibit a crystalline state or phase, as well as an amorphous state or phase. The different structural states of a chalcogenide material differ with respect to the relative proportions of the crystalline phase and amorphous phase in a given volume or region of the chalcogenide material. The range of resistance values is bounded by a SET state and a RESET state of the chalcogenide material. The SET state is a low resistance structural state whose electrical properties are primarily controlled by the crystalline portion of the chalcogenide material. The RESET state is a high resistance structural state whose electrical properties are primarily controlled by the amorphous portion of the chalcogenide material.

However, there are some notable challenges associated with the implementation of PCM in AI devices. For instance, PCM-based AI devices are vulnerable without current compliance capabilities. Exceeding the compliance current of the device during programming can permanently damage the chalcogenide material, rendering the PCM inoperable.

Therefore, techniques for controlling the programming current of PCM-based AI devices would be desirable.

SUMMARY OF THE INVENTION

The present invention provides techniques for controlling the programming current of a phase change memory (PCM)-based artificial intelligence (AI) device using an external resistor. In one aspect of the invention, a PCM cell is provided. The PCM cell includes: a PCM stack, that has a bottom electrode; a heater disposed directly on the bottom electrode; a PCM unit including a first material disposed on the heater; a top electrode including a second material disposed on the PCM unit; and a resistor adjacent to the PCM stack, wherein the resistor includes a combination of the first material and the second material.

In another aspect of the invention, a PCM device is provided. The PCM device includes: a set of first metal lines; a set of second metal lines; PCM cells in between the set of first metal lines and the set of second metal lines, wherein at least one of the PCM cells includes a PCM stack, and a resistor adjacent to the PCM stack, wherein the PCM stack has a bottom electrode, a heater disposed directly on the bottom electrode, a PCM unit including a first material disposed on the heater, and a top electrode including a second material disposed on the PCM unit, and wherein the resistor includes a combination of the first material and the second material.

In yet another aspect of the invention, a method of forming a PCM cell is provided. The method includes: forming a bottom electrode in an interlayer dielectric (ILD); depositing a hardmask layer onto the ILD over the bottom electrode; forming a heater in the hardmask layer over, and in direct contact with, the bottom electrode; depositing a phase change layer including a first material onto the hardmask layer over the heater; depositing a top electrode layer including a second material onto the phase change layer; and patterning the phase change layer and the top electrode layer to form a PCM unit and a top electrode over the heater, and a resistor adjacent to the PCM unit and the top electrode.

A more complete understanding of the present invention, as well as further features and advantages of the present invention, will be obtained by reference to the following detailed description and drawings.

DETAILED DESCRIPTION OF PREFERRED EMBODIMENTS

Figures 1, 2:
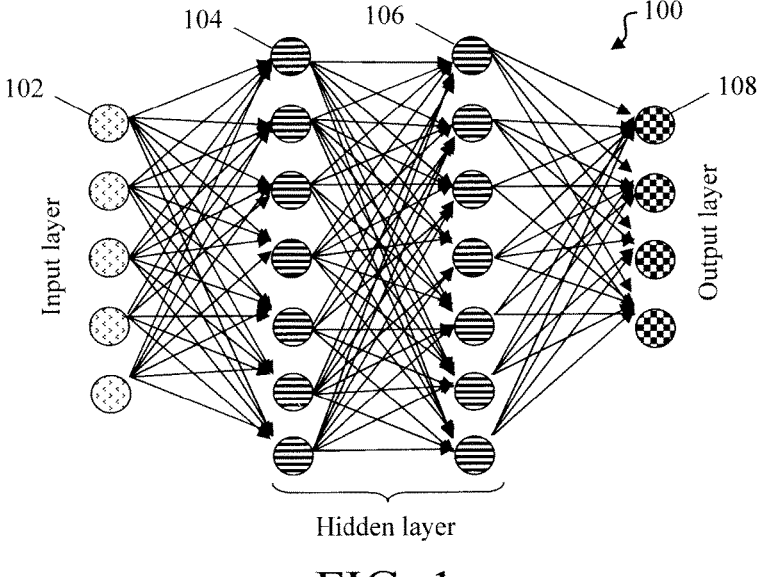
FIG. 1 is a schematic diagram illustrating an exemplary neural network according to an embodiment of the present invention.
FIG. 2 is a diagram illustrating an analog cross-point array of the present phase change memory (PCM) cells which can embody an artificial intelligence (AI) system such as the neural network of FIG. 1 according to an embodiment of the present invention.

As provided above, current compliance is a notable challenge associated with the implementation of phase change memory (PCM) in artificial intelligence (AI) devices. For instance, programming currents that exceed the compliance current can potentially damage the PCM material. Advantageously, it has been found herein that an external resistor can be employed to control programming current. Further, it has been found herein that employing high resistance materials such as titanium nitride (TiN) and/or tantalum nitride (TaN) provides the resistance needed for programming current control while at the same time providing an area savings based on a relatively smaller resistor structure as compared to resistors using conventional materials such as copper (Cu) which would require a much longer wire to provide the same resistance.

As will be described in conjunction with the description of FIG. 2 below, an analog cross-point array of the present PCM cells can embody an AI system such as a neural network. In machine learning and cognitive science, neural networks are a family of statistical learning models inspired by the biological neural networks of animals, and in particular the brain. Neural networks may be used to estimate or approximate systems and cognitive functions that depend on a large number of inputs and weights of the connections which are generally unknown.

Neural networks are often embodied as so-called "neuromorphic" systems of interconnected processor elements that act as simulated "neurons" that exchange "messages" between each other in the form of electronic signals. See, for example, FIG. 1 which provides a schematic illustration of an exemplary neural network 100. As shown in FIG. 1, neural network 100 includes a plurality of interconnected processor elements 102, 104/106 and 108 that form an input layer, at least one hidden layer, and an output layer, respectively, of the neural network 100.

Similar to the so-called 'plasticity' of synaptic neurotransmitter connections that carry messages between biological neurons, the connections in a neural network that carry electronic messages between simulated neurons are provided with numeric weights that correspond to the strength or weakness of a given connection. The weights can be adjusted and tuned based on experience, making neural networks adaptive to inputs and capable of learning. For example, a neural network is defined by a set of input neurons (see, e.g., input layer 102 in neural network 100). After being weighted and transformed by a function determined by the network's designer, the activations of these input neurons are then passed to other downstream neurons, which are often referred to as 'hidden' neurons (see, e.g., hidden layers 104 and 106 in neural network 100). This process is repeated until an output neuron is activated (see, e.g., output layer 108 in neural network 100). The activated output neuron makes a class decision. Instead of utilizing the traditional digital model of manipulating zeros and ones, neural networks such as neural network 100 create connections between processing elements that are substantially the functional equivalent of the core system functionality that is being estimated or approximated.

For instance, by way of example only, FIG. 2 is a diagram illustrating analog cross-point array 200 of the present PCM cells 202 which can embody an AI system such as the above-described neural network 100. As shown in FIG. 2, the PCM cells 202 are present between two sets of metal lines. Namely, analog cross-point array 200 includes a plurality of first metal lines 204 present below the PCM cells 202 and a plurality of second metal lines 206 present above the PCM cells 202. In one embodiment, the first metal lines 204 are oriented orthogonal to the second metal lines 206, and a single given PCM cells 202 is present at each intersection of the first metal lines 204 and the second metal lines 206.

An exemplary methodology for forming the present PCM-based AI device is now described by way of reference to FIGS. 3-15. For clarity and ease of depiction, FIGS. 3-15 illustrate a given area 208 of the above-described analog cross-point array 200 (see FIG. 2) that includes one of the present PCM cells 202. However, one skilled in the art would recognize that the process is performed in the same manner described to produce, in duplicate, all of the PCM cells 202 in the analog cross-point array 200.

Figure 3:
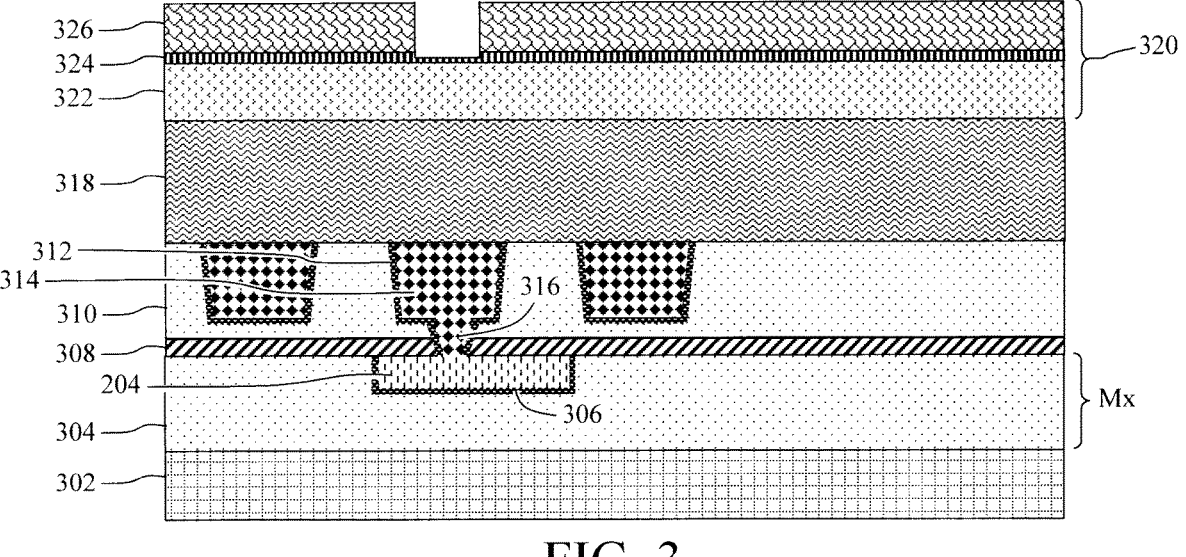
FIG. 3 is a cross-sectional diagram illustrating a first metal layer Mx that includes first metal lines embedded in a (first) interlayer dielectric (ILD) having been formed on a substrate, a (first) capping layer having been deposited onto the first ILD over the first metal lines, a (second) ILD having been deposited onto the first capping layer, bottom electrodes having been formed in the second ILD, a (first) hardmask layer having been formed on the second ILD over the bottom electrodes, and a lithographic stack having been formed on the first hardmask layer according to an embodiment of the present invention.

As shown in FIG. 3 (a cross-sectional view), the process begins with the formation of a first metal layer Mx on a substrate 302. According to an exemplary embodiment, substrate 302 is a bulk semiconductor wafer, such as a bulk silicon (Si), bulk germanium (Ge), bulk silicon germanium (SiGe) and/or bulk III-V semiconductor wafer. Alternatively, substrate 302 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Although not shown in the figures, substrate 302 may already have pre-built structures such as transistors, diodes, capacitors, resistors, interconnects, wiring, etc.

To form the first metal layer Mx, an interlayer dielectric (ILD) 304 is first deposited onto the substrate 302. Suitable ILD 304 materials include, but are not limited to, nitride materials such as silicon nitride (SiN) and/or oxide materials such as silicon oxide (SiOx) and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as chemical vapor deposition (CVD), atomic layer deposition (ALD) or physical vapor deposition (PVD) can be employed to deposit the ILD 304 onto the substrate 302. Following deposition, the ILD 304 can be planarized using a process such as chemical-mechanical polishing (CMP).

The first metal lines 204 are then formed in the ILD 304. Note that FIG. 3 depicts a given area 208 that includes one of the present PCM cells 202, and hence a single one of the first metal lines 204. However, as described above, the analog cross-point array 200 includes a plurality of the first metal lines 204 below a plurality of the PCM cells 202. Like structures are numbered alike in the figures.

Standard lithography and etching techniques are then employed to pattern features (e.g., trenches and/or vias) in the ILD 304 which are filled with a metal (or a combination of metals) to form the first metal lines 204. With standard lithography and etching techniques, a lithographic stack (not shown), e.g., photoresist/anti-reflective coating (ARC)/organic planarizing layer (OPL), is used to pattern a hardmask (not shown) with the footprint and location of the features to be patterned. Alternatively, the hardmask can be formed by other suitable techniques, including but not limited to, sidewall image transfer (SIT), self-aligned double patterning (SADP), self-aligned quadruple patterning (SAQP), and other self-aligned multiple patterning (SAMP). An etch is then used to transfer the pattern from the hardmask to the underlying ILD 304. A directional (anisotropic) etching process such as reactive ion etching (RIE) can be employed for the etch. Suitable hardmask materials include, but are not limited to, nitride hardmask materials such as SiN, silicon oxynitride (SiON) and/or silicon carbide nitride (SiCN), and/or oxide hardmask materials such as SiOx.

Suitable metal(s) include, but are not limited to, copper (Cu), cobalt (Co), ruthenium (Ru) and/or tungsten (W), which can be deposited using a process such as evaporation, sputtering or electrochemical plating. Following deposition, the metal overburden can be removed using a process such as CMP. Prior to depositing the metal(s), a conformal barrier layer 306 can be deposited into and lining the features. Use of such a barrier layer helps to prevent diffusion of the metal(s) into the surrounding ILD 304. Suitable barrier layer materials include, but are not limited to, tantalum (Ta), tantalum nitride (TaN), titanium (Ti), and/or titanium nitride (TiN), which can be deposited using a process such as CVD, ALD or PVD. Additionally, a seed layer (not shown) can be deposited into and lining the features prior to metal deposition. A seed layer facilitates plating of the metal(s) into the features.

A capping layer 308 is then deposited onto the ILD 304 over the first metal lines 204. Suitable materials for the capping layer 306 include, but are not limited to, SiN, SiON and/or silicon oxycarbonitride (SiOCN), which can be deposited using a process such as CVD, ALD or PVD. According to an exemplary embodiment, the capping layer 306 has a thickness of from about 2 nanometers (nm) to about 5 nm and ranges therebetween.

An ILD 310 is then deposited onto the capping layer 308. For clarity, the terms 'first' and 'second' may also be used herein when referring to ILD 304 and ILD 310, respectively. Suitable materials for the ILD 310 include, but are not limited to, SiN, SiOx and/or SiCOH and/or ULK-ILD materials such as pSiCOH, which can be deposited using a process such as CVD, ALD or PVD. Following deposition, the ILD 310 can be planarized using a process such as CMP.

Bottom electrodes 314 are then formed in the ILD 310. As will be described in detail below, during operation of the present analog cross-point array 200, (resistive) heaters will be employed to heat and thereby switch the PCM cells 202 between two states, i.e., a low resistance crystalline state and a high resistance amorphous state. The bottom electrodes 314 will interconnect the first metal lines 204 and the heaters. As shown in FIG. 3, one of the bottom electrodes 314 is formed directly over a select one of the first metal lines 204, and a metal via 316 is used to interconnect the two structures.

Standard lithography and etching techniques (see above) can be employed to pattern features (e.g., trenches and/or vias) in the ILD 310 which are then filled with a metal(s) to form the bottom electrodes 314 and metal via 316. As provided above, suitable metals include, but are not limited to, Cu, Co, Ru and/or W, which can be deposited using a process such as evaporation, sputtering or electrochemical plating. Following deposition, the metal overburden can be removed using a process such as CMP. Prior to depositing the metal(s), a conformal barrier layer 312 can be deposited into and lining the features to prevent diffusion of the metal(s) into the surrounding ILD 310. As provided above, suitable barrier layer materials include, but are not limited to, Ta, TaN, Ti, and/or TiN, which can be deposited using a process such as CVD, ALD or PVD. Additionally, a seed layer (not shown) can be deposited into and lining the features prior to metal deposition to facilitate plating of the metal(s) into the features.

A hardmask layer 318 is then formed on the ILD 310 over the bottom electrodes 314. Suitable materials for hardmask layer 318 include, but are not limited to, SiN, SiON, SiCN, and/or SiOx, which can be deposited using a process such as CVD, ALD or PVD. According to an exemplary embodiment, the hardmask layer 318 has a thickness of from about 10 nm to about 30 nm and ranges therebetween.

A lithographic stack 320 is then formed on the hardmask layer 318. As described above, the lithographic stack 320 includes an OPL 322 disposed on the hardmask layer 318, an ARC 324 disposed on the OPL 322, and a photoresist 326 disposed on the ARC 324. As shown in FIG. 3, the photoresist 326 is patterned with the footprint and location of the heater over a select one of the bottom electrodes 314/first metal lines 204.

Figure 4:
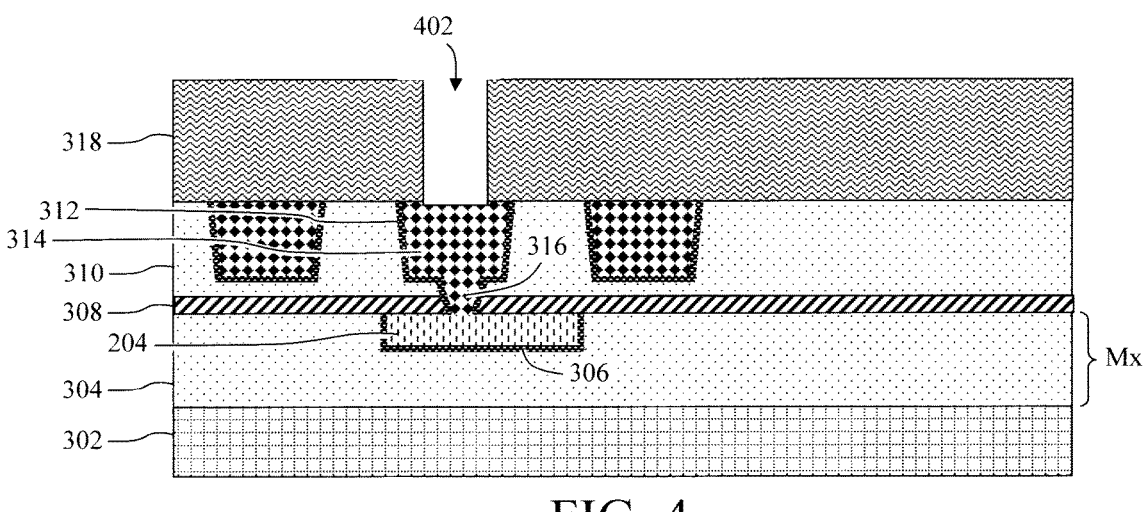
FIG. 4 is a cross-sectional diagram illustrating an etch having been used to transfer a pattern from the lithographic stack to the first hardmask layer to form a heater pore over a select one of the bottom electrodes and first metal lines, after which what remains of the lithographic stack is removed according to an embodiment of the present invention.

An etch is then used to transfer the pattern from the photoresist 326 to the ARC 324, the OPL 322, and the underlying hardmask layer 318, after which what remains of the lithographic stack 320 is then removed. See FIG. 4 (a cross-sectional view). A directional (i.e., anisotropic) etching process such as RIE can be employed. As shown in FIG. 4, a heater pore 402 is now present over a select one of the bottom electrodes 314 and first metal lines 204. Notably, the select bottom electrode 314 is exposed at the bottom of the heater pore 402 which will enable the heater formed in the heater pore 402 to be in direct contact with that bottom electrode 314.

A heater is then formed in the heater pore 402. According to an exemplary embodiment, the heater is formed from multiple layers such as alternating layers of a (relatively higher resistivity) material A and a (relatively lower resistivity) material B, i.e., material A has a higher resistivity than material B. For instance, referring to FIG. 5 (a cross-sectional view), a layer 502 of the material A is first deposited onto the hardmask layer 318 and into, and lining the heater pore 402. Suitable (higher resistivity) materials (A) for layer 502 include, but are not limited to, TaN and/or SiN, which can be deposited using a process such as CVD, ALD or PVD. According to an exemplary embodiment, the layer 502 of the material A has a thickness of from about 2 nm to about 10 nm and ranges therebetween.

A layer 504 of the material B is then deposited onto the layer 502 of the material A. Suitable (lower resistivity) materials (B) for layer 504 include, but are not limited to, TiN, which can be deposited using a process such as CVD, ALD or PVD. According to an exemplary embodiment, the layer 504 of the material B has a thickness of from about 2 nm to about 10 nm and ranges therebetween.

Figure 5:
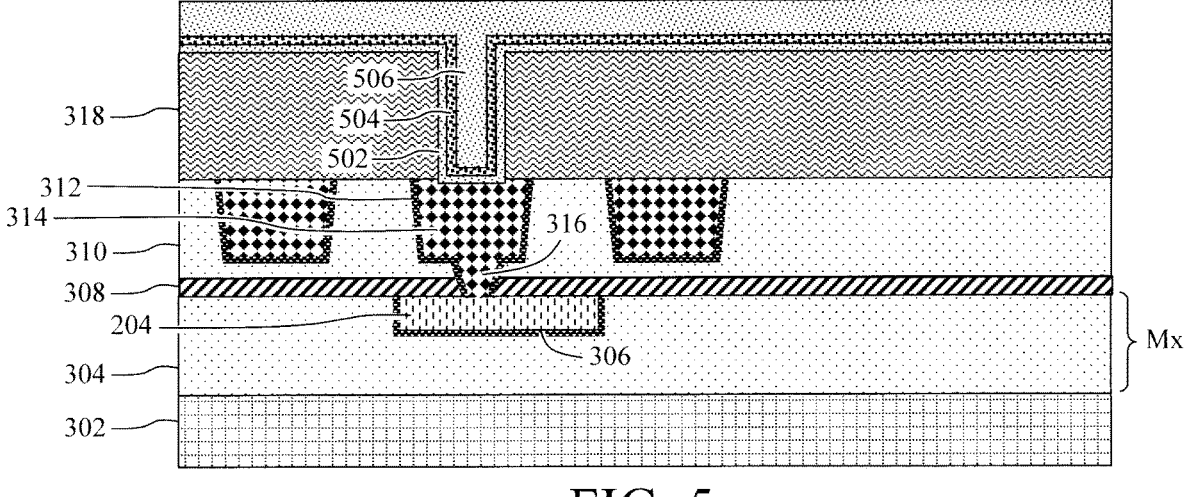
FIG. 5 is a cross-sectional diagram illustrating alternating layers of a (relatively higher resistivity) material A and a (relatively lower resistivity) material B having been deposited onto the onto the first hardmask layer and into, and lining the heater pore according to an embodiment of the present invention.

Next, a layer 506 of the material A is deposited onto the layer 504 of the material B filling the heater pore 402. As provided above, suitable (higher resistivity) materials (A) for layer 506 include, but are not limited to, TaN and/or SiN, which can be deposited using a process such as CVD, ALD or PVD. According to an exemplary embodiment, the layer 506 of the material A has a thickness of from about 10 nm to about 20 nm and ranges therebetween. It is notable, however, that the combination of materials A/B shown in FIG. 5 is merely one option for forming the heater in accordance with the present techniques, and other configurations are contemplated herein. For example, one or more of the layers 502, 504 and 506 can be eliminated from the design in order to reduce production complexity.

Figure 6:
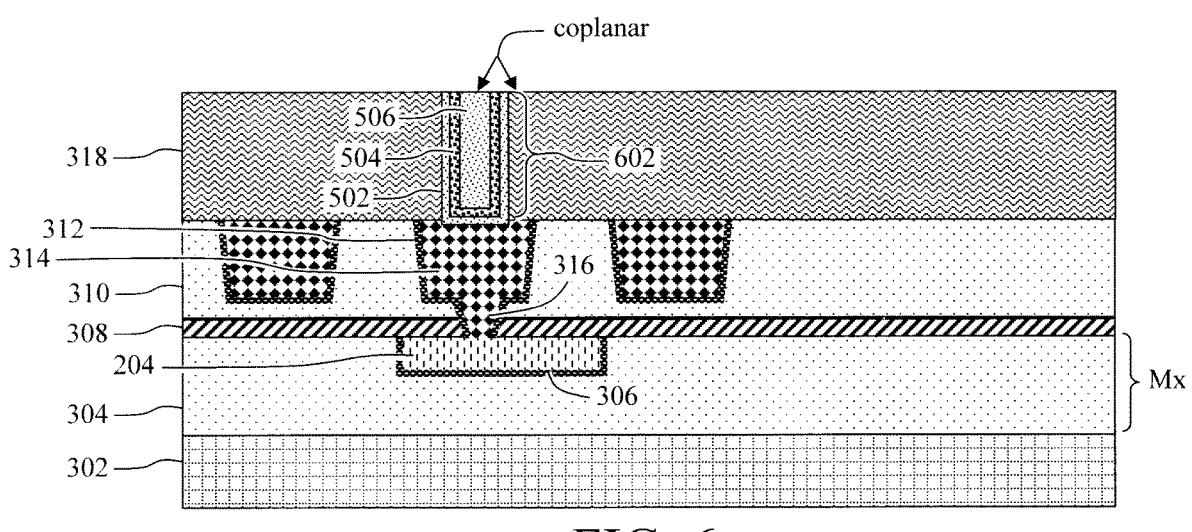
FIG. 6 is a cross-sectional diagram illustrating the layers of material A and material B having been polished down to the surface of the first hardmask layer forming a heater disposed over, and in direct contact with, the select bottom electrode according to an embodiment of the present invention.
Figure 7:
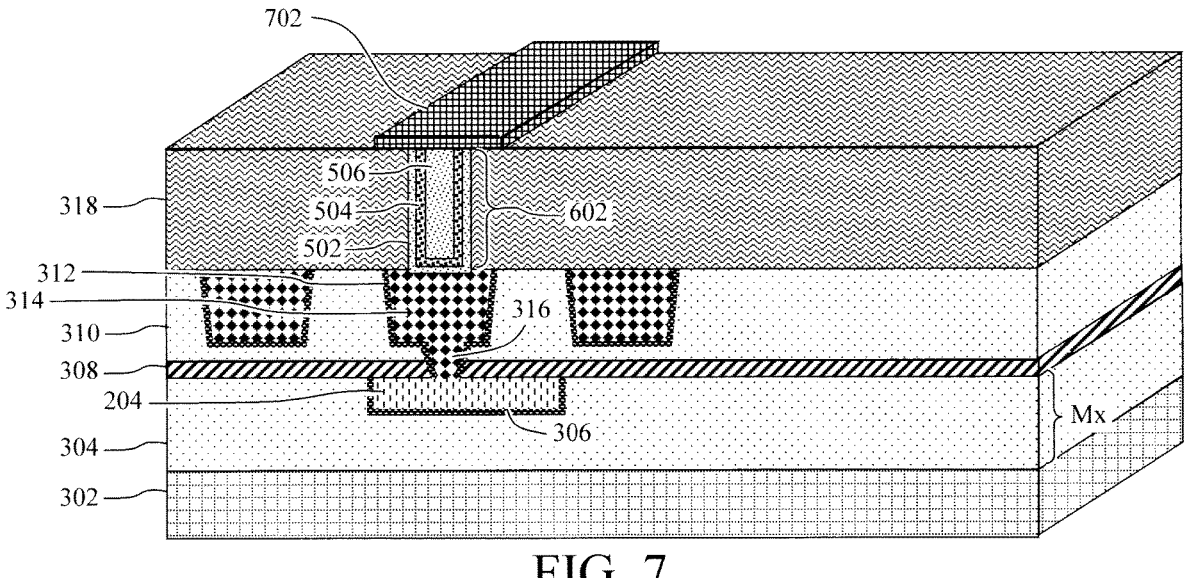
FIG. 7 is a cross-sectional diagram illustrating a projected liner having been formed on the first hardmask layer over the heater according to an embodiment of the present invention.

Following deposition, the layers 502, 504 and 506 are polished down to the top surface of the hardmask layer 318 forming heater 602 disposed over, and in direct contact with, the select bottom electrode 314. See FIG. 6 (a cross-sectional view). By way of example only, a process such as CMP can be used to polish the layers 502, 504 and 506. As shown in FIG. 6, the top surface of the heater 602 is coplanar with a top surface of the hardmask layer 318.

An (electrically conductive) projected liner 702 is then formed on the hardmask layer 318 over the heater 602. See FIG. 7, which provides a three-dimensional view of the device structure at this point in the process. Suitable materials for the projected liner 702 include, but are not limited to, TiN, TaN, tungsten nitride (WN), titanium silicide (TiSi), cobalt silicide (CoSi), nickel silicide (NiSi), titanium carbide (TiC), tantalum carbide (TaC), tungsten (W), cobalt (Co), platinum (Pt), palladium (Pd) and/or tantalum (Ta), which can be deposited using a process such as CVD, ALD or PVD. Standard lithography and etching techniques (see above) can then be employed to pattern the deposited material(s) into the projected liner 702 shown in FIG. 7. According to an exemplary embodiment, the projected liner 702 has a thickness of from about 2 nm to about 5 nm and ranges therebetween.

The projected liner 702 serves to improve linearity in the resistance of the present PCM cell. Namely, as will be described in detail below, a phase change material will be deposited onto the projected liner 702 over the heater 602. During a write operation, the heater 602 will be used to switch the phase change material between two states, i.e., a low resistance crystalline state and a high resistance amorphous state. However, during a read operation, the projected liner 702 acts as a parallel resistor that permits current to pass around the (high resistance) amorphous phase change material. See, for example, Koelmans et al., "Projected phase-change memory devices," nature communications (September 2015) (7 pages) and U.S. Patent Application Publication Number 2021/0305503 by Philip et al., entitled "Projected Phase Change Memory Devices."

Figure 8:
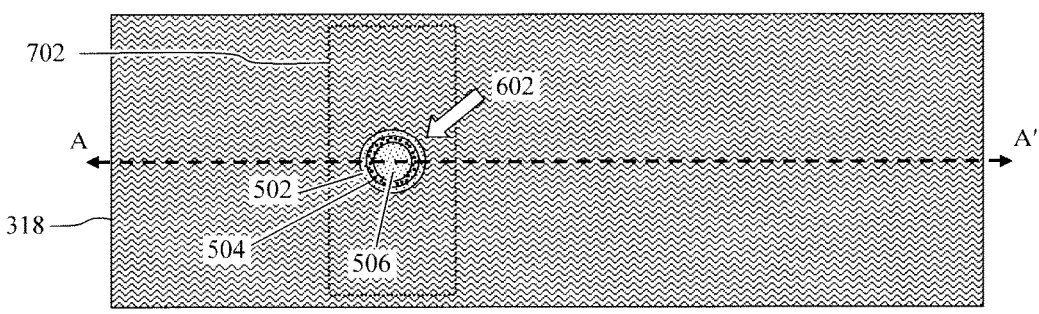
FIG. 8 is a top-down diagram of the structure following formation of the projected liner according to an embodiment of the present invention.
Figure 9:
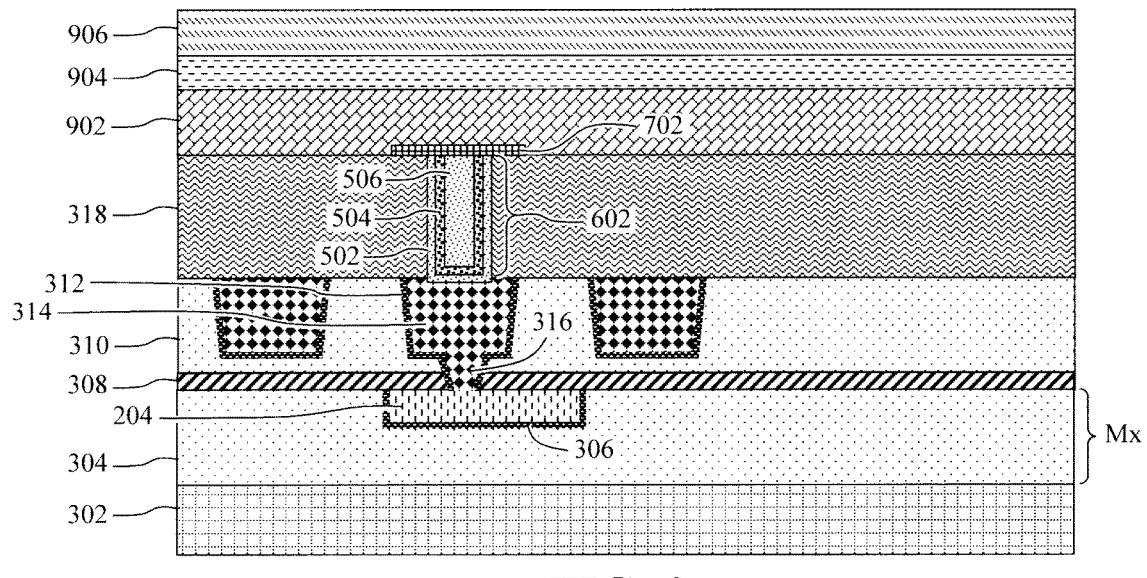
FIG. 9 is a cross-sectional diagram illustrating a phase change layer having been deposited onto the first hardmask layer over the projected liner and underlying heater, a top electrode layer having been deposited onto the phase change layer, and a (second) hardmask layer having been deposited onto the top electrode layer according to an embodiment of the present invention.

FIG. 8 provides a top-down view of the structure following formation of the projected liner 702. Only the outline of the projected liner 702 is depicted in FIG. 8 in order to also illustrate the underlying heater 602. As shown in FIG. 8, the heater is a circular column formed by the concentric layers 502, 504 and 506. In the present example, projected liner 702 has a rectangular shape. However, any shape can be employed for the projected liner 702 as long as it covers over the heater 602. It is notable that the cross-sectional views provided in the figures depict cuts through the structure along line A-A' shown in FIG. 8.

A phase change layer 902 is then deposited onto the hardmask layer 318 over the projected liner 702 and underlying heater 602, a top electrode layer 904 is deposited onto the phase change layer 902, and a hardmask layer 906 is deposited onto the top electrode layer 904. See FIG. 9 (a cross-sectional view). For clarity, the terms 'first' and 'second' may also be used herein when referring to hardmask layer 318 and hardmask layer 906, respectively.

A wide variety of phase change materials can be employed for phase change layer 902. Namely, in the sense that it can exist in amorphous and crystalline form, almost any material is a phase change material, such as metals, semiconductors or insulators. However, only a small group of materials has the properties that makes them technologically useful phase change materials, with high on/off resistance ratio, fast switching times and good data retention. For instance, according to an exemplary embodiment, the phase change layer 902 is formed from a chalcogenide, meaning that phase change layer 902 contains at least one chalcogenide element. Generally, chalcogenides are the elements in Group 16 of the periodic table of elements such as sulfur (S), selenium (Se) and/or tellurium (Te). In one embodiment, the phase change layer 902 includes a chalcogenide alloy that has the element Te (chalcogen) in combination with at least one other element such as antimony (Sb) and/or germanium (Ge), forming the alloys $Sb_2Te_3$, GeTe and/or $Ge_2Sb_2Te_5$ (GST). It is notable, however, that the present techniques are not limited to the use of only chalcogenides in the phase change layer 902. For instance, alternatively the phase change layer 902 can include III-V semiconductor materials (such as gallium antimonide (GaSb)) and/or Ge—Sb based alloys. Additionally, elements such as silver (Ag), indium (In), nitrogen (N) and/or bismuth (Bi) can be added to the phase change layer 1902 to optimize its properties.

A process such as CVD, PVD, or molecular beam epitaxy (MBE) can be employed to deposit the phase change layer 902 onto the hardmask layer 318. The specific targets (PVD) or precursors (CVD) for the deposition process depend on the particular phase change material being formed. For example, when PVD is used to deposit $Ge_2Sb_2Te_5$ the most common source is a $Ge_2Sb_2Te_5$ target. Separate elemental Ge, Sb and Te targets can also be used by adjusting the flux from each target to obtain the desired composition. According to an exemplary embodiment, phase change layer 902 has a thickness of from about 10 nm to about 20 nm and ranges therebetween.

Suitable materials for the top electrode layer 904 include, but are not limited to, TiN and/or TaN, which can be deposited using a process such as evaporation or sputtering. According to an exemplary embodiment, the top electrode layer 904 has a thickness of from about 5 nm to about 10 nm and ranges therebetween.

Suitable materials for the hardmask layer 906 include, but are not limited to, SiN, SiON, SiCN, and/or SiOx, which can be deposited using a process such as CVD, ALD or PVD.

According to an exemplary embodiment, the hardmask layer 906 has a thickness of from about 5 nm to about 15 nm and ranges therebetween.

Figure 10:
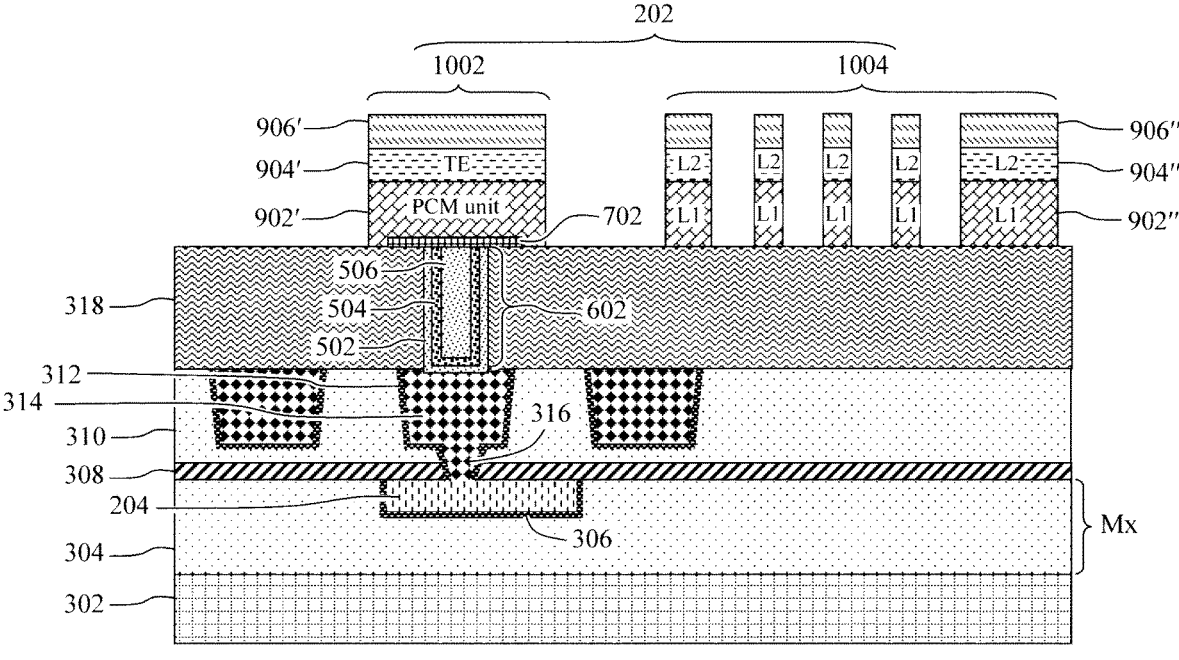
FIG. 10 is a cross-sectional diagram illustrating the second hardmask layer having been used to pattern the top electrode layer and the phase change layer to form a PCM stack (having a PCM unit and a top electrode TE), and a resistor (having a first layer L1 and a second layer L2) on the first hardmask layer adjacent to the PCM stack, whereby the PCM stack and the resistor together form one of the present PCM cells according to an embodiment of the present invention.

Standard lithography and etching techniques (see above) are then employed to pattern the hardmask layer 906, followed by an etch (e.g., RIE) to transfer the pattern from the hardmask layer 906 to the top electrode layer 904 and the phase change layer 902, to form a PCM stack 1002, and a resistor 1004 on the hardmask layer 318 adjacent to the PCM stack 1002. See FIG. 10 (a cross-sectional view). As shown in FIG. 10, the PCM stack 1002 and the resistor 1004 each includes patterned portions 902'/904'/906' and 902"/904"/906" of the phase change layer 902/top electrode layer 904/hardmask layer 906, respectively. Notably, since the resistor 1004 is patterned from the same layers as the PCM stack 1002, the resistor 1004 contains the same combination of layers/materials, i.e., patterned portions 902"/904"/906" of the phase change layer 902/top electrode layer 904/hardmask layer 906, as the PCM stack 1002, i.e., patterned portions 902'/904'/906' of the phase change layer 902/top electrode layer 904/hardmask layer 906, arranged in same manner, having the same thicknesses, etc.

As shown in FIG. 10, the PCM stack 1002 includes a bottom electrode 314 (which is connected to one of the first metal lines 204 by way of metal via 316), the heater 602 disposed on and in direct contact with the bottom electrode 314, the projected liner 702 disposed over the heater 602, a PCM unit formed by the patterned portion 902' of the phase change layer, and a top electrode (TE) formed by the patterned portion 904' of the top electrode layer. The resistor 1004 includes a first layer (L1) formed by the patterned portion 902" of the phase change layer, and a second layer (L2) formed by the patterned portion 904" of the top electrode layer disposed on the first layer L1. It is notable that, while these patterned portions 902" and 904" of the phase change layer and top electrode layer in the resistor 1004 appear discontinuous in cross-section, they are in fact part of the same continuous (e.g., serpentine-shaped) layers. See, for example, the description of FIG. 11, below.

Reference may also be made herein to a 'first material' and a 'second material' when referring to the materials in the phase change layer 902 (e.g., the above-described chalcogenides) and the top electrode layer 904 (e.g., TiN and/or TaN as described above), respectively. In that regard, the PCM unit is formed from the first material, the top electrode or TE is formed from the second material, and the resistor 1004 is formed from a combination of the first and second materials. Namely, the first layer L1 of the resistor 1004 is formed from the first material and the second layer L2 of the resistor 1004 is formed from the second material.

As shown in FIG. 10, the PCM stack 1002 and the resistor 1004 together form one of the present PCM cells 202 in the above-described analog cross-point array 200 (see FIG. 2).

While the area shown in the figures includes only one of the PCM cells 202, as provided above the process is performed in the same manner described to produce, in duplicate, all of the PCM cells 202 in the analog cross-point array 200. Thus, the configuration of each of the PCM cells 202 in analog cross-point array 200 is identical to that shown in FIG. 10.

Figure 11:
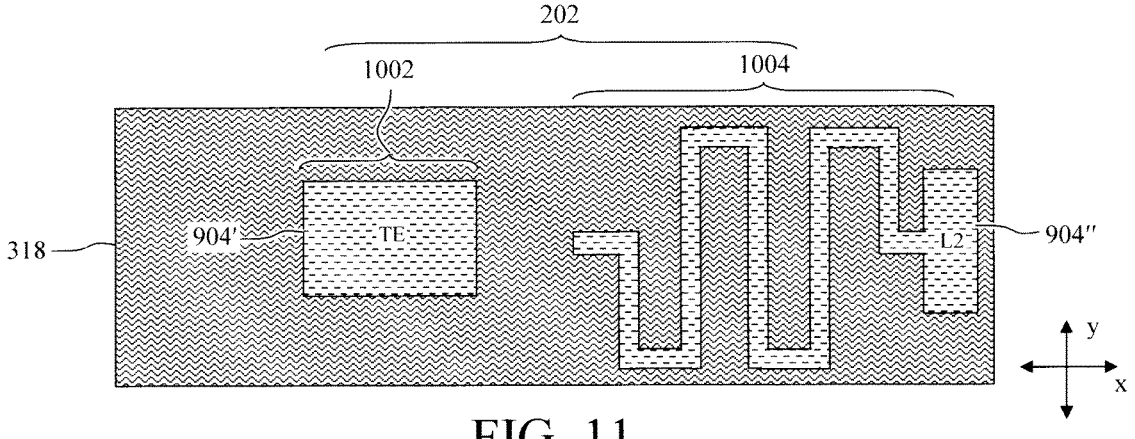
FIG. 11 is a top-down diagram of the structure illustrating how the as-patterned resistor can have a serpentine shape according to an embodiment of the present invention.
Figure 12:
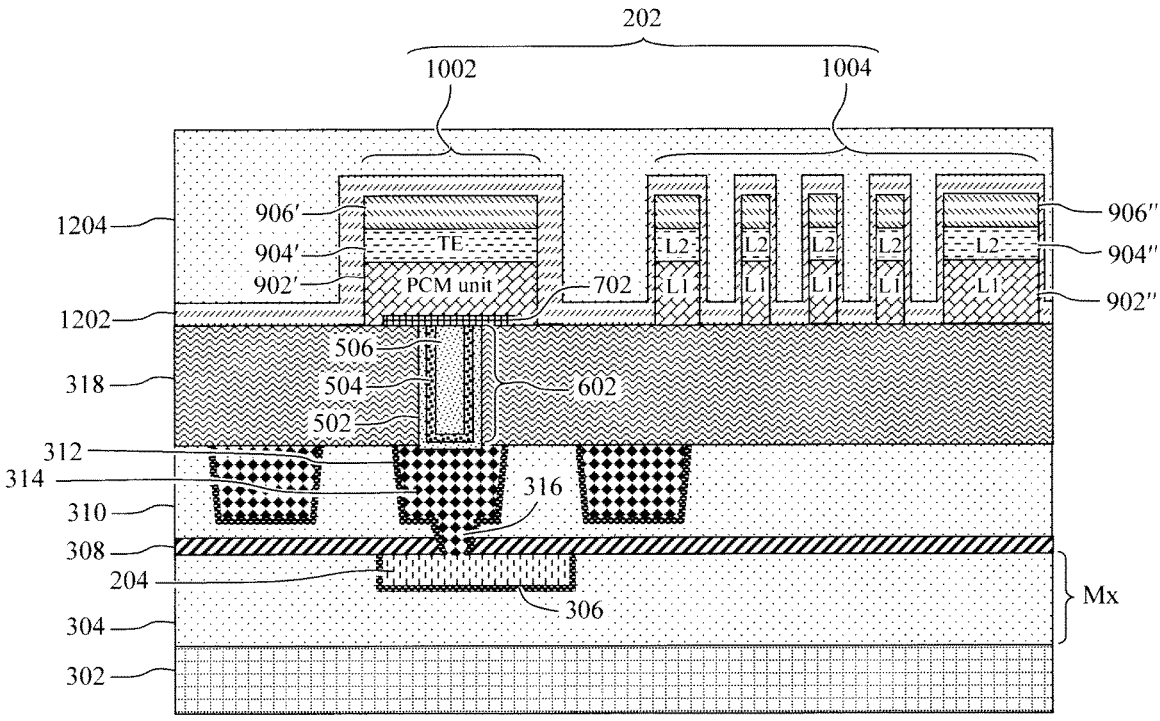
FIG. 12 is a cross-sectional diagram illustrating a conformal encapsulation layer having been deposited onto the surface of the first hardmask layer and over the PCM stack and the resistor, and a (third) ILD having been deposited onto the encapsulation layer over and burying the PCM cell according to an embodiment of the present invention.

According to an exemplary embodiment, the as-patterned resistor 1004 has a serpentine shape. See, for example, FIG. 11 (a top-down view). In FIG. 11, the patterned portions 906' and 906" of the hardmask layer are not shown in order to better illustrate the footprint of the PCM cell 202. Namely, as shown in FIG. 11, the patterned portions 902' and 902" of the phase change layer (obscured in this view) and the patterned portions 904' and 904" of the top electrode layer form continuous first and second layers L 1 and L2 of the resistor 1004 having a serpentine shape. By 'serpentine shape' it is meant that at least a portion of resistor 1004 loops back and forth along both an x-direction and a y-direction. Employing such a serpentine configuration advantageously enables a reduction of the series resistance area.

A conformal encapsulation layer 1202 is then deposited onto the surface of the hardmask layer 318 and over the PCM stack 1002 and the resistor 1004. See FIG. 12 (a cross-sectional view). Suitable materials for encapsulation layer 1202 include, but are not limited to, SiN, SiON and/or SiOCN, which can be deposited using a process such as CVD, ALD or PVD. According to an exemplary embodiment, encapsulation layer 1202 has a thickness of from about 2 nm to about 5 nm and ranges therebetween. Encapsulation layer 1202 serves to protect the exposed surfaces of the phase change material, such as along the sidewalls of PCM unit.

A second metal layer Mx+1 is then formed over the PCM cell 202. The second metal layer Mx+1 will serve to interconnect the PCM stack 1002 and the resistor 1004, as well as to provide the second metal lines 206 with access to the resistor 1004. To form the second metal layer Mx+1, an ILD 1204 is first deposited onto the encapsulation layer 1202 over and burying the PCM cell 202. For clarity, the term 'third' may also be used herein when referring to ILD 1204 so as to distinguish it from the 'first' ILD 304 and the 'second' ILD 310. Suitable materials for ILD 1204 include, but are not limited to, SiN, SiOx and/or SiCOH and/or ULK-ILD materials such as pSiCOH, which can be deposited using a process such as CVD, ALD or PVD. Following deposition, the ILD 1204 can be planarized using a process such as CMP.

Interconnects 1304 and 1306 are then formed in the ILD 1204. See FIG. 13 (a cross-sectional view). Namely, standard lithography and etching techniques are first employed to pattern features (e.g., trenches and/or vias) in the ILD 1204, encapsulation layer 1202 and patterned portions 906' and 906" of the hardmask layer 906, which are then filled with a metal(s) to form the interconnects 1304 and 1306. Suitable metal(s) include, but are not limited to, Cu, Co, Ru and/or W, which can be deposited using a process such as evaporation, sputtering or electrochemical plating. Following deposition, the metal overburden can be removed using a process such as CMP. Prior to depositing the metal(s), a conformal barrier layer 1302 can be deposited into and lining the features. Use of such a barrier layer helps to prevent diffusion of the metal(s) into the surrounding ILD 1204. As provided above, suitable barrier layer materials include, but are not limited to, Ta, TaN, Ti, and/or TiN, which can be deposited using a process such as CVD, ALD or PVD. Additionally, a seed layer (not shown) can be deposited into and lining the features prior to metal deposition. A seed layer facilitates plating of the metal(s) into the features.

Figures 13, 14:
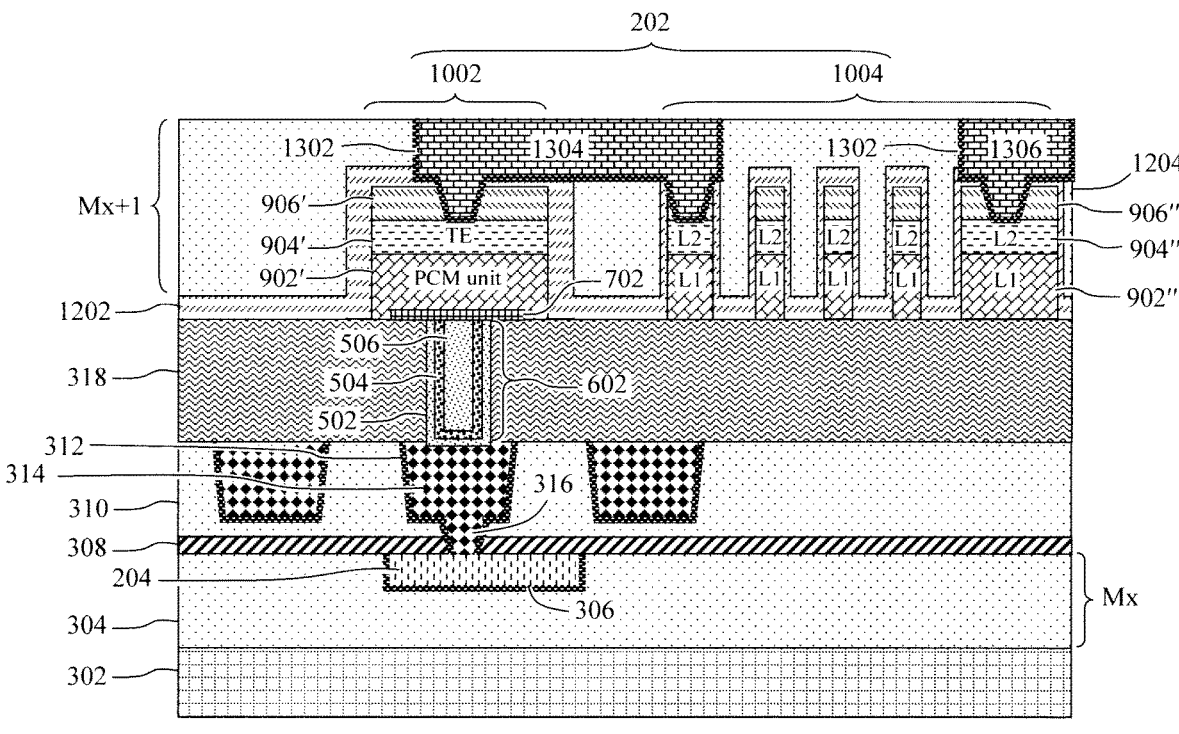
FIG. 13 is a cross-sectional diagram illustrating interconnects having been formed in the third ILD creating a second metal layer Mx+1 over the PCM cell according to an embodiment of the present invention.
FIG. 14 is a top-down diagram of the structure following formation of the interconnects which illustrates how one of the interconnects connects the PCM stack to a first end of the resistor, and how another one of the interconnects is present over, and in contact with, a second/opposite end of the resistor according to an embodiment of the present invention.
Figure 15:
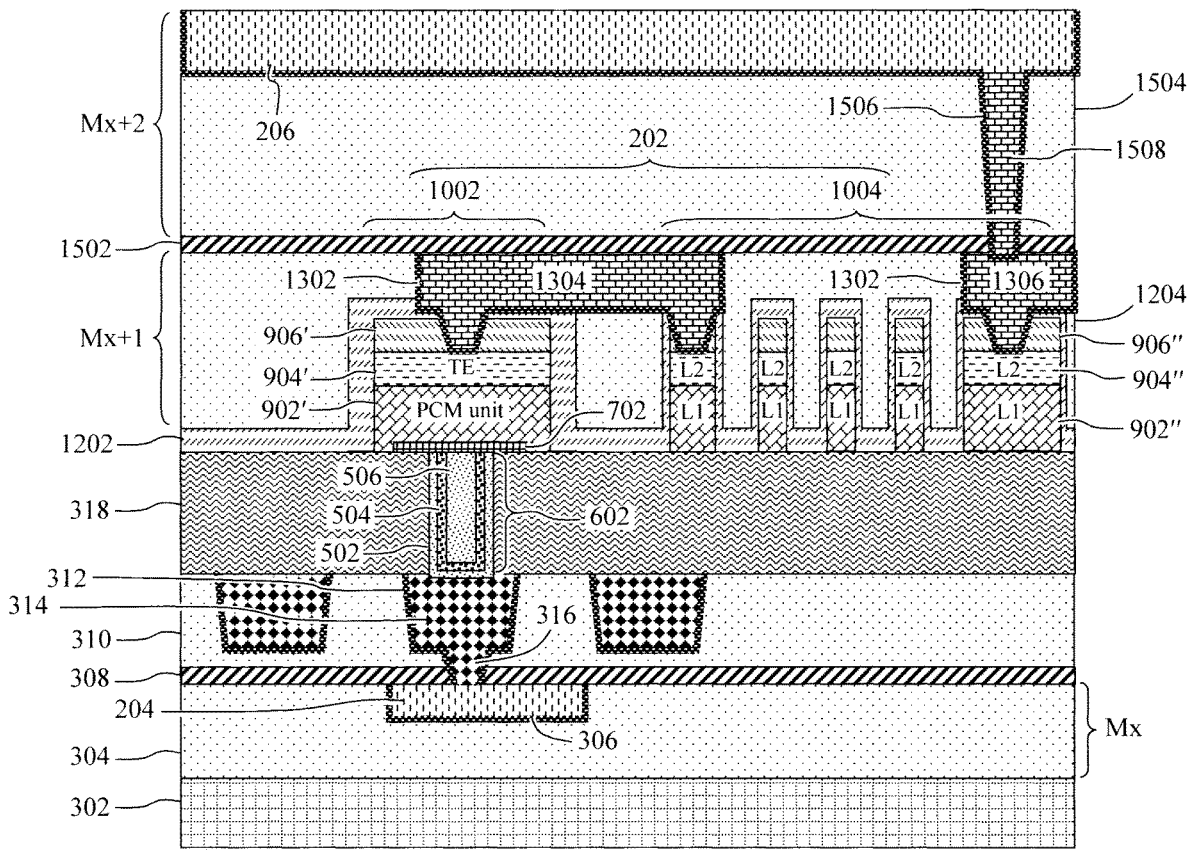
FIG. 15 is a cross-sectional diagram illustrating a (second) capping layer having been deposited onto the third ILD over the interconnects, a (fourth) ILD having been deposited onto the second capping layer over the interconnects, and second metal lines and a metal via (connecting the second metal lines to one of the interconnects) having been formed in the fourth ILD according to an embodiment of the present invention.

As shown in FIG. 13, interconnect 1304 contacts both the top electrode (TE) of the PCM stack 1002 and a first end of the resistor 1004. Thus, interconnect 1304 interconnects the PCM stack 1002 to the resistor 1004 to complete the PCM cell 202. Interconnect 1306 contacts a second end of the resistor 1004 that is opposite the first end. As will be described in detail below, interconnect 1306 will serve to connect the resistor 1004 to the second metal lines 206.

As shown in FIG. 14 (a top-down view), interconnect 1304 connects PCM stack 1002 to the first end of the resistor 1004, and the interconnect 1306 is present over, and in contact with, the second/opposite end of the resistor 1004. In FIG. 14, the overlying layers such as the encapsulation layer 1202 and the ILD 1204, as well as the patterned portions 906' and 906" of the hardmask layer are not shown in order to better illustrate how the interconnect 1304 directly contacts the top electrode (TE) of the of the PCM stack 1002 and the second layer L2 at the first end of the resistor 1004, and how the interconnect 1306 directly contacts the second layer L2 at the second/opposite end of the resistor 1004.

A third metal layer Mx+2 containing the second metal lines 206 is then formed over the second metal layer Mx+1. To do so, a capping layer 1502 is first deposited onto the ILD 1204 over the interconnects 1302 and 1306. See FIG. 15 (a cross-sectional view). For clarity, the terms 'first' and 'second' may also be used herein when referring to capping layer 308 and capping layer 1502. Suitable materials for the capping layer 1502 include, but are not limited to, SiN, SiON and/or SiOCN, which can be deposited using a process such as CVD, ALD or PVD. According to an exemplary embodiment, the capping layer 1502 has a thickness of from about 2 nm to about 5 nm and ranges therebetween.

An ILD 1504 is then deposited onto the capping layer 1502 over the interconnects 1302 and 1306. For clarity, the term 'fourth' may also be used herein when referring to ILD 1504, so as to distinguish it from the 'first' ILD 304, the 'second' ILD 310, and the 'third' ILD 1204. Suitable materials for ILD 1504 include, but are not limited to, SiN, SiOx and/or SiCOH and/or ULK-ILD materials such as pSiCOH, which can be deposited using a process such as CVD, ALD or PVD. Following deposition, the ILD 1504 can be planarized using a process such as CMP.

The second metal lines 206 and a metal via 1508 connecting the second metal lines 206 to the interconnect 1306 are then formed in the ILD 1504. Namely, standard lithography and etching techniques are first employed to pattern features (e.g., trenches and/or vias) in the ILD 1504 and capping layer 1502, which are then filled with a metal(s) to form the second metal lines 206 (one of which is shown in the present depiction) and the metal via 1508. Suitable metal(s) include, but are not limited to, Cu, Co, Ru and/or W, which can be deposited using a process such as evaporation, sputtering or electrochemical plating. Following deposition, the metal overburden can be removed using a process such as CMP. Prior to depositing the metal(s), a conformal barrier layer 1506 can be deposited into and lining the features. Use of such a barrier layer helps to prevent diffusion of the metal(s) into the surrounding ILD 1504. As provided above, suitable barrier layer materials include, but are not limited to, Ta, TaN, Ti, and/or TiN, which can be deposited using a process such as CVD, ALD or PVD. Additionally, a seed layer (not shown) can be deposited into and lining the features prior to metal deposition. A seed layer facilitates plating of the metal(s) into the features.

In this example, the metal via 1508 connects the second metal lines 206 to the second end of the resistor 1004 opposite the PCM stack 1002 which is at the first end of the resistor 1004. With this configuration, the resistor 1004 is present in series with second metal lines 206 and the PCM stack 1002.

During programming of analog cross-point array 200, a SET operation is used to program one or more of the present PCM cells 202 to a low resistance structural state representing a data value such as a logic '1' or a logic '0'. The SET state is a low resistance structural state whose electrical properties are primarily controlled by the crystalline portion of the phase change material in the PCM unit. The data values can be read from the analog cross-point array 200 during a read operation. A subsequent RESET operation is then used to return the PCM cells 202 to their previous high resistance structural state. The RESET state is a high resistance structural state whose electrical properties are primarily controlled by the amorphous portion of the phase change material.

Heater 602 is employed to produce the heat (by resistive heating) used to switch the PCM unit of PCM cells 202 between the low resistance crystalline state and the high resistance amorphous state. To change a PCM cell 202 from the amorphous to the crystalline state, a SET programming voltage pulse is applied to the heater 602 in order to heat the phase change material in the PCM unit (i.e., the patterned portion 902' of the phase change layer) above its crystallization temperature for a sufficiently long time. As a result, the phase change material in the PCM unit will arrange itself into a crystalline state during that heating time. To change the phase change material in the PCM unit from the crystalline state to the amorphous state, a RESET programming voltage pulse is applied to the heater 602 in order to heat the phase change material in the PCM unit above its melting temperature and then quenched (quickly cooled). By this action, the phase change material in the PCM unit will not have time to rearrange itself in an ordered state, and the amorphous state will be the result. Both the crystallization temperature and melting temperature vary depending on the particular phase change material being employed. Advantageously, the resistor 1004 (which is in series with the PCM stack 1002) provides the resistance needed for programming current control while at the same time providing an area savings based on a relatively smaller resistor structure as compared to resistors using conventional materials such as Cu.

As compared to the SET/RESET programming voltage pulses, according to an exemplary embodiment the PCM cells 202 are read by applying a lower read voltage pulse for a shorter period of time. For example, the read voltage pulse can be less than either the SET or RESET programming voltage pulses. Further, reading has the read voltage applied for less than that of the SET or RESET times. For example, the read time can be less than half of the RESET time, and the read voltage pulse can be less than half of the SET programming voltage pulse. Furthermore, the RESET programming voltage pulse can be double or more the SET programming voltage pulse, and the SET time can be double, triple, 5 times, or more of the RESET time.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A phase change memory (PCM) cell, comprising:
   a PCM stack, comprising:
   a bottom electrode;
   a heater disposed directly on the bottom electrode;
   a PCM unit comprising a first material disposed on the heater;
   a top electrode comprising a second material disposed on the PCM unit; and
   a resistor laterally adjacent to the PCM stack, wherein the resistor comprises a combination of the first material and the second material, wherein the first material of the resistor is located on the same level as the PCM unit and the second material of the resistor is located on the same level as the top electrode.

2. The PCM cell of claim 1, wherein the first material comprises a chalcogenide-based phase change material.

3. The PCM cell of claim 2, wherein the chalcogenide-based phase change material comprises tellurium (Te) in combination with an element selected from the group consisting of: antimony (Sb), germanium (Ge), and combinations thereof.

4. The PCM cell of claim 1, wherein the second material is selected from the group consisting of: titanium nitride (TiN), tantalum nitride (TaN), and combinations thereof.

5. The PCM cell of claim 1, wherein the resistor comprises a layer of the second material disposed on a layer of the first material.

6. The PCM cell of claim 1, wherein the resistor has a serpentine shape.

7. The PCM cell of claim 1, wherein the PCM stack further comprises:
   a projected liner disposed over the heater, and wherein the PCM unit is disposed over the projected liner.

8. The PCM cell of claim 7, wherein the projected liner comprises a material selected from the group consisting of: TiN, TaN, tungsten nitride (WN), titanium silicide (TiSi), cobalt silicide (CoSi), nickel silicide (NiSi), titanium carbide (TIC), tantalum carbide (TaC), tungsten (W), cobalt (Co), platinum (Pt), palladium (Pd), tantalum (Ta), and combinations thereof.

9. The PCM cell of claim 1, wherein the heater comprises alternating layers of a material A and a material B, wherein a resistivity of the material A is greater than a resistivity of the material B.

10. The PCM cell of claim 9, wherein the material A is selected from the group consisting of: TaN, silicon nitride (SiN), and combinations thereof.

11. The PCM cell of claim 9, wherein the material B comprises TiN.

12. The PCM cell of claim 1, further comprising:
   a hardmask layer disposed over the bottom electrode, wherein the heater is present in the hardmask layer, and wherein the resistor is disposed directly on the hardmask layer.

13. A phase change memory (PCM) device, comprising:
   a set of first metal lines;
   a set of second metal lines;
   PCM cells in between the set of first metal lines and the set of second metal lines, wherein at least one of the PCM cells comprises a PCM stack, and a resistor adjacent to the PCM stack, wherein the PCM stack comprises a bottom electrode, a heater disposed directly on the bottom electrode, a PCM unit comprising a first material disposed on the heater, and a top electrode comprising a second material disposed on the PCM unit, and wherein the resistor comprises a combination of the first material and the second material.

14. The PCM device of claim 13, wherein the first material comprises a chalcogenide-based phase change material.

15. The PCM device of claim 14, wherein the chalcogenide-based phase change material comprises Te in combination with an element selected from the group consisting of: Sb, Ge, and combinations thereof.

16. The PCM device of claim 13, wherein the second material is selected from the group consisting of: TiN, TaN, and combinations thereof.

17. The PCM device of claim 13, wherein the resistor comprises a layer of the second material disposed on a layer of the first material.

18. The PCM device of claim 13, wherein the resistor has a serpentine shape.

19. A phase change memory (PCM) cell, comprising:
   a PCM stack, comprising:
   a bottom electrode;
   a heater disposed directly on the bottom electrode;
   a PCM unit comprising a first material disposed on the heater;
   a top electrode comprising a second material disposed on the PCM unit;
   a resistor adjacent to the PCM stack, wherein the resistor comprises a combination of the first material and the second material; and
   a hardmask layer disposed over the bottom electrode, wherein the heater is present in the hardmask layer, and wherein the resistor is disposed directly on the hardmask layer.

* * * * *